(12) United States Patent
Zeng (10) Patent No.: US 10,324,133 B2
(45) Date of Patent: Jun. 18, 2019

(54) MULTIFUNCTIONAL CHARGING BOX

(71) Applicant: Shenzhen Energy Storage Electronics Co.,LTD, Shenzhen (CN)

(72) Inventor: Jinhui Zeng, Shenzhen (CN)

(73) Assignee: SHENZHEN ENERGY STORAGE ELECTRONICS CO., LTD, Shenzhen (CN)

( * ) Notice: Subject to any disclaimer, the term of this patent is extended or adjusted under 35 U.S.C. 154(b) by 60 days.

(21) Appl. No.: 15/597,591

(22) Filed: May 17, 2017

(65) Prior Publication Data

US 2018/0316203 A1    Nov. 1, 2018

(30) Foreign Application Priority Data

Apr. 27, 2017  (CN) .................... 2017 2 0453864 U (51) Int. Cl.
*H02J 7/00* (2006.01)
*G01R 31/36* (2019.01)

(52) U.S. Cl.
CPC ........ *G01R 31/3646* (2019.01); *H02J 7/0029* (2013.01); *H02J 7/0042* (2013.01); *H02J 7/0054* (2013.01); *H02J 7/0068* (2013.01); *H02J 2007/0037* (2013.01); *H02J 2007/0062* (2013.01)

(58) Field of Classification Search
CPC .................................................... H02J 7/0044
USPC ........................................................ 320/107
See application file for complete search history.

(56) References Cited

U.S. PATENT DOCUMENTS

| | | | | |
|---|---|---|---|---|
| 5,939,858 A | * | 8/1999 | Dodd | H02J 7/0042 180/68.5 |
| 2010/0090646 A1 | * | 4/2010 | Mori | H02J 7/0042 320/113 |
| 2011/0273132 A1 | * | 11/2011 | Khaitan | H01M 10/46 320/101 |
| 2014/0335919 A1 | * | 11/2014 | Stewart | H02J 7/0042 455/573 |
| 2015/0162760 A1 | * | 6/2015 | Clark | H02J 7/0045 320/103 |
| 2017/0077724 A1 | * | 3/2017 | Clark | H02J 7/0045 |

* cited by examiner

*Primary Examiner* — Suresh Memula
(74) *Attorney, Agent, or Firm* — Hauptman Ham, LLP (57) ABSTRACT

The utility model discloses a multifunctional charging box, comprising an upper cover, an upper shell, a lower shell, a base and a handle, wherein the base is fixedly connected with a battery unit for controlling circuit board; a control switch, an LED indicator, an input interface, several output interfaces and an LED floodlight are arranged on the said upper shell; the charging box can charge electric tool and other products through output interfaces; the LED floodlight can be used as charging box in a bad light or independently used as floodlight, or to send SOS signal under emergency situation; the charging box is provided with handle for facilitating carrying and use, can be put in bag, held in hand, hung, placed on desktop, hung on the waist and back. The charging box of the utility model is of simple structure, flexible design, multiple functions, and it's convenient to carry.

8 Claims, 9 Drawing Sheets

MULTIFUNCTIONAL CHARGING BOX

TECHNICAL DOMAIN

The utility model relates to a charging device, more particularly, relates to a multifunctional charging box.

BACKGROUND OF THE INVENTION

Along with the social development and continuous progress of science and technology, the electric tool, the unmanned machine, the mobile phone and other electronic products in use of battery are increasingly applied for being not limited by power source. However, the battery for the electric tool, the unmanned machine and others can be charged by special charger; the electric tool cannot be used after the power failure if no special charger is carried along; it is also inconvenient to use the electric tool under the poor light condition, the safety hidden trouble may be caused since other person may not find out the user. Besides, some electronic products cannot be used at the place without external power source when the products are out of power source. The application of some existing chargers is single and needs to improve.

BRIEF DESCRIPTION

The utility model aims to provide a small portable device, which can charge various electric tools for a long term, and also charge the unmanned machine, mobile phone and other electronic products, and light under the poor light condition.

For solving the problems existing in the prior art, the utility model provides a multifunctional charging box.

In order to realize the purpose, the utility model applies the technical scheme below:

A multifunctional charging box, comprising an upper cover, an upper shell, a lower shell, and a base; it further comprises a battery unit arranged at the bottom part in the lower shell and fixed on the base; a battery protection plate is arranged on the battery unit, and the control circuit board is fixed on the battery protection plate; it further comprises a control switch arranged on the upper shell and an LED indicator; it further comprises an input interface for charging the charging box of the electric tool, output interfaces arranged on the upper shell for charging the electric tool and output interfaces for charging the other products, such as intelligent identifying mobile phone, flat panel and other electronic devices; it further comprises an LED floodlight arranged on the upper shell and a handle fixed on the lower shell.

The battery unit is responsible for the power energy storage, namely, the power energy is stored through battery, and the battery unit consists of chargeable batteries of nickel hydrogen, nickel-cadmium, lithium battery, lead-acid batteries, and others.

The control circuit board controls the charge, discharge, communication, light, input and output control, and other functions of the whole charging box, so as to guarantee the normal use of the multifunctional charging box.

The LED indicator can indicate the current battery power state, and is further provided with the working state indication for reminding other persons of carefully avoiding the multifunctional charging box when it is in use.

When the light condition is poor, the LED floodlight can assist the multifunctional charging box for lighting use during the working process as well as independent use as the floodlight.

Under the emergency condition, the LED floodlight can send the SOS emergency rescue signal, and the specific operation is as below: press and hold the control switch for 5 seconds, make the LED floodlight blink according to the model of three short lights, three long lights and three short lights (international standard SOS distress light signal), and thereby sending the SOS emergency distress signal.

The input and output interfaces can be composed of one or more pieces, one or more kinds of (such as USB interface, DC and EC5 interface). Through the input interface, the other power source can charge the multifunctional charging box; through the output interface, the multifunctional charging box can charge the electric tool and other products.

DETAIL DESCRIPTION

In order to make that the technical problem solved by the utility model, the technical scheme and achieved technical effect are easy to understand, the below will further specify the specific implementation method of the utility model by referring to the specific drawings.

Figure 1:
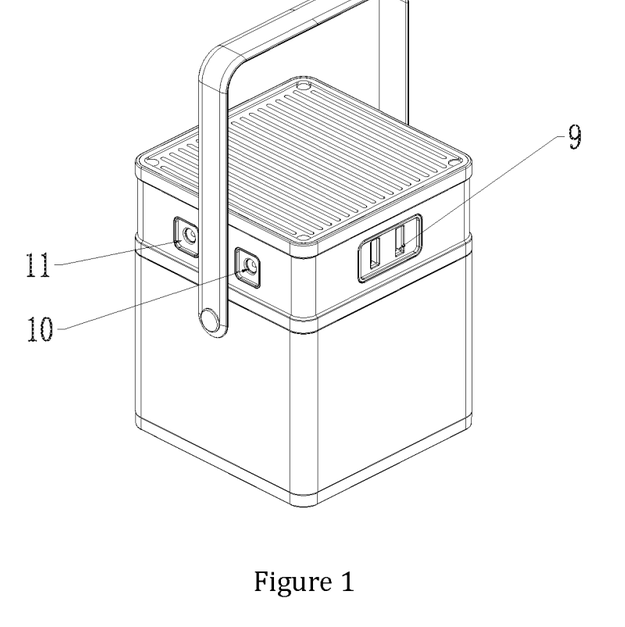
FIG. 1 represents a structure diagram of an embodiment of the charging box of the utility model.
Figure 2:
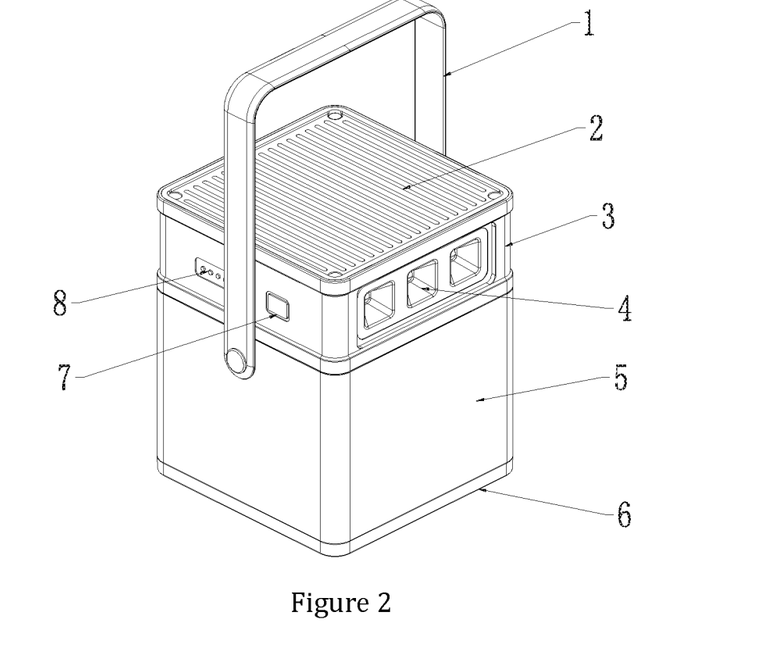
FIG. 2 represents a back view of FIG. 1.
Figure 3:
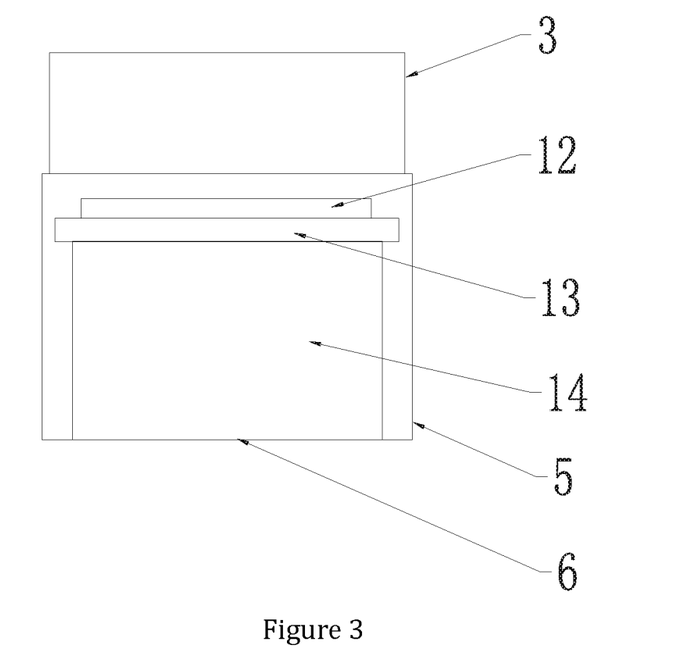
FIG. 3 represents an internal structure diagram of the charging box of the utility model.

As shown in FIGS. 1-3, in a specific embodiment, a multifunctional charging box comprises a handle 1, an upper cover 2, an upper shell 3, a lower shell 5, and a base 6; it further comprises a battery unit 14 arranged at the inner part in the lower shell 5 and fixed on the base 6; a battery protection plate 13 is arranged on the battery unit 14, and the control circuit board 12 is fixed on the battery protection plate 13 and connected with every associated part; one side on the upper shell 3 closing to the handle 1 is provided with a control switch 7 and an LED indicator 8; the other side on the upper shell 3 closing to the handle 1 is provided with an input interface 10 and output interfaces 11 for charging the electric tool; one side on the upper shell 3 without the handle 1 is provided with the LED floodlight 4, and the other corresponding side is provided with output interfaces 19 for charging the other products.

Figure 8:
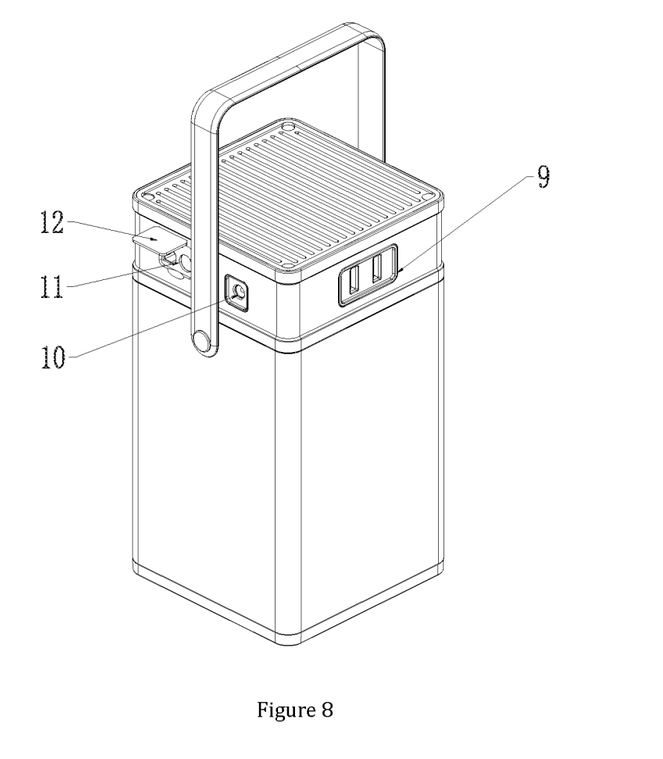
FIG. 8 represents a structure diagram of the other one embodiment of the charging box of the utility model.
Figure 9:
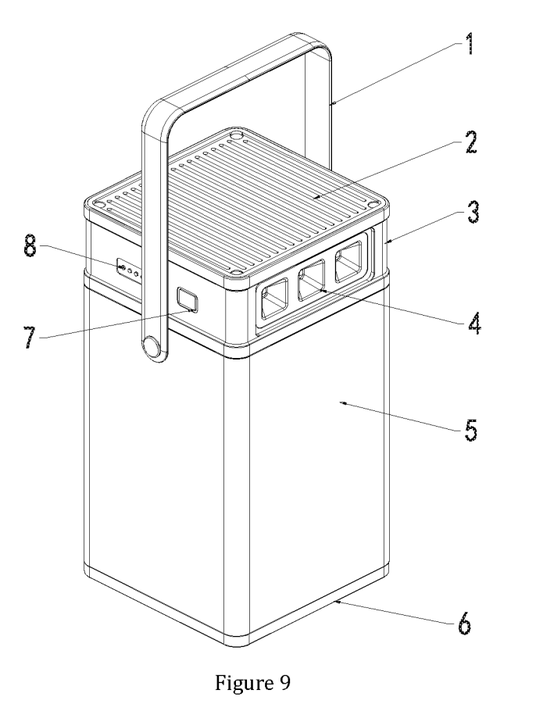
FIG. 9 represents the back view of FIG. 8.

As shown in FIGS. 8-9, in the other specific embodiment, the output interfaces 11 of the multifunctional charging box apply the EC5 interface, and are provided with anti-dust covers 12; the maximum current output is 60V 100 A; through the EC5 interface and the connection wire, the output interfaces can supply power to various power tools, tool batteries and unmanned machines, and so on.

This charging box applies lithium cores, and multiple lithium cores are connected in series and in parallel, so as to output different voltages and currents, thus power supplies to different power tools and tool batteries can be satisfied; the input interface 10 can be charged by the DC power source; the output interface 9 can supply power to one USB interface and one TYPE-C interface, and also two USB interfaces and two TYPE-C interfaces, or multiple USB interfaces and multiple TYPE-C interfaces, and two or more intelligent mobile phones, flat panels and electronic devices at the same time.

The LED indicator 8 can segmentally display the power the remaining power can be learned in real time, and the working state of the charging box can be displayed. The LED indicator also can remind other person of carefully avoiding the multifunctional charging box when it is in use at present.

The control switch 7 is an integrated button switch which is responsible for the on-off of power source and LED light, and model conversion.

The LED floodlight 4 can be used for lighting and supplementing light and sending SOS signal under the emergency situation.

Figure 4:
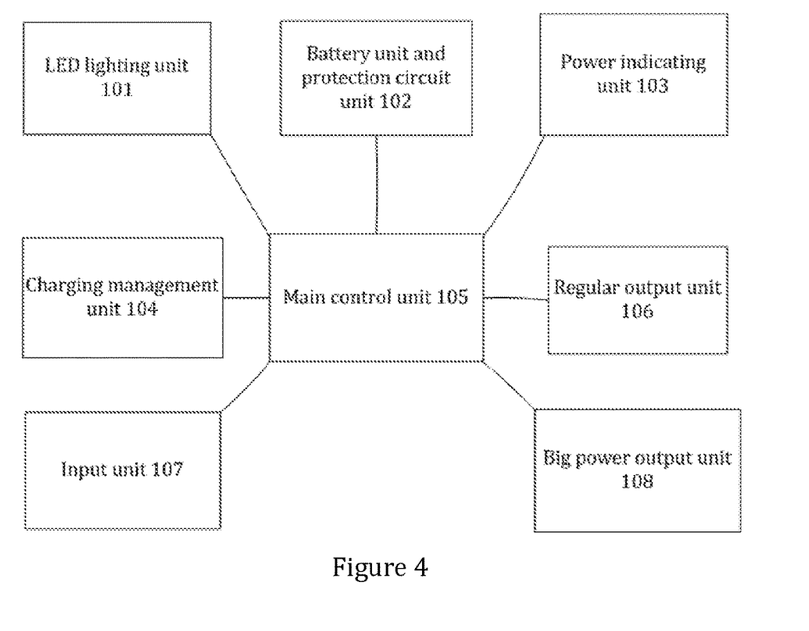
FIG. 4 represents an electric principle block diagram of the charging box of the utility model.

The electrical principle block diagram of the multifunctional charging box is shown as FIG. 4, the multifunctional charging box comprises a battery unit connected with the main control unit 15, a protection circuit unit 102 and a charging management unit 104; it further comprises an LED lighting unit 101, quantity power indicating unit 103, a regular output unit 106, a big power output unit 108 and an input unit 107 which are respectively connected with the main control unit 105. The main control unit 105 is arranged on the control circuit board 12.

The LED lighting unit 101 is provided with one or more LED light; when the light condition is bad, the LED floodlight can assist the multifunctional charging box for lighting use during the working process as well as independent use as the floodlight.

Under the emergency condition, the LED lighting unit 101 can send the SOS emergency rescue signal, and the specific operation is as below: press and hold the control switch for 5 seconds, make the LED floodlight blink according to the model of three short lights, three long lights and three short lights (international standard SOS distress light signal), and thereby sending the SOS emergency distress signal.

The battery unit and the battery unit in the protection circuit unit 102 are mainly used for storing energy; in charging, the power energy is stored, and then released at work; the battery unit can be composed of nickel hydrogen, nickel-cadmium, lithium battery, and other chargeable batteries; the protection circuit is mainly used for protecting the battery safety and preventing the core from damaging by overcharge and over-release.

The power indicating unit 103 can indicate the battery power state at present, display the power segmentally, and learn about the remaining power in real time.

The charging management unit 104 can manage the charge of external input power, and ensure safe charging to the battery unit.

The main control unit 105 is provided with a MCU and a control switch; the main control unit controls the charge, discharge, light, input, output and other functions of the whole charging device, so as to ensure the normal use of the charging device.

The regular output unit 106 is provided with output interfaces; the output interfaces can be composed of one or more pieces, one or more kinds of (such as USB interface and DC interface). Through the output interface, the multifunctional lithium battery charging box can charge the electric tool and other products.

The big power output unit 108 is specialized in charging the external lithium battery, and can automatically identify voltage of the lithium battery and correctly charge. The lithium battery output unit is provided with the output interface; the output interfaces can be composed of one or more pieces, one or more kinds of (such as USB interface, DC and EC5 interface). Through the output interface, the multifunctional lithium battery charging box can charge the lithium battery; the multifunctional unmanned machine charging device can charge the unmanned machine.

The input unit 107 is provided with the input interface, which is connected with the charging power input from outer part; the input interface can be composed of one or more pieces, one or more kinds of (such as USB interface, DC, EC5 interface). Through the input interfaces, the external power source can charge the multifunctional lithium battery charging box.

The utility model can charge the lithium battery, automatically identify the serial number of the lithium battery, charge correct voltage and ensure the charging safety of the battery.

The working principle thereof is: the lithium battery output unit 7 of the lithium battery charging device is linked with a detection resistor in series; the MCU of the main control unit 5 detects voltage and current through the signal feedback from the detection resistor, and then the output charging voltage is determined.

The battery to be charged and the lithium battery charging device are connected through the DC line; after start-up, the output interface of the regular output unit 6 or the lithium battery output unit 7 outputs a 20V small current impulse signal to the battery; the MCU detects the voltage through the signal feedback from the detection signal, and then the charging voltage to be output is determined.

The specific condition of the core charging is as below (taking 1-4 series of cores as an example):

The lithium battery has the protection circuit which can prevent the cell from being overcharged; the protection voltage for fully charging the single cell is 4.25 V or 4.35 V; the overshoot protection voltages of two strings are 8.5 V or 8.7 V; the protection voltages of three strings is 12.75 V or 13.05 V, and the protection voltages of four strings is 17V or 17.4 V.

1. When the single cell is charged, if the feedback voltage is less than 4.25 V, it is judged as single cell; the charging voltage of the lithium battery charging device is 4.25V, and the battery is charged. When the battery voltage is charged to 4.25V, the lithium battery charging device can present a 4.35V small current signal; if the MCU detection voltage is 4.35 V, thus the battery is 4.25V and has been fully charged, and the electric box stops power supply; the voltage detected by MCU is 4.25 V, thus it means that the battery is 4.35V high-voltage cell, and the lithium battery charging device can continuously charge the battery with 4.35 V voltage; after the battery is charged to 4.35V, the lithium battery charging device presents a 4.4 V small current signal, and the voltage detected by the MCU is 4.4 V; thus the lithium battery charging device stops power supply.

2. When the two-string cell is charged, if the feedback voltage is more than 4.35V and less than 8.5 V, it is judged as two-string cell; the charging voltage of the lithium battery charging device is 8.5V, and the battery is charged. When the battery voltage is charged to 8.5V, the lithium battery charging device can present a 8.7V small current signal; if the MCU detection voltage is 8.7 V, thus the battery is 8.5V and has been fully charged, and the lithium battery charging device stops power supply; the voltage detected by MCU is 8.5 V, thus it means that the battery is 8.7V high-voltage cell, and the lithium battery charging device can continuously charge the battery with 8.7 V voltage; after the battery is charged to 8.7V, the lithium battery charging device presents a 8.8 V small current signal, and the voltage detected by the MCU is 8.7 V; thus the electric box stops power supply.

3. When the three-string cell is charged, the lithium battery charging device is provided with a 8.8V small current signal on the basis of the two-string cell charging; the voltage detected by MCU is 8.7V, thus it means that the battery is three-string; the charging voltage presented by the lithium battery charging device is 12.75V, and the battery is charged. When the battery voltage is charged to 12.75V, the lithium battery charging device can present a 13.05V small current signal; if the MCU detection voltage is 13.05 V, thus the battery is 12.75V and has been fully charged, and the lithium battery charging device stops power supply; the voltage detected by MCU is 12.75 V, thus it means that the battery is 13.05V high-voltage cell, and the lithium battery charging device can continuously charge the battery with 13.05 V voltage; after the battery is charged to 13.05V, the lithium battery charging device presents a 13.1 V small current signal, and the voltage detected by the MCU is 13.1 V; thus the lithium battery charging device stops power supply.

4. When the four-string cell is charged, the lithium battery charging device is provided with a 13.1V small current signal on the basis of the three-string cell charging; the voltage detected by MCU is 13.05V, thus it means that the battery is four-string; the charging voltage presented by the lithium battery charging device is 17V, and the battery is charged. When the battery voltage is charged to 17V, the lithium battery charging device can present a 17.4V small current signal; if the MCU detection voltage is 17.4 V, thus the battery is 17V and has been fully charged, and the lithium battery charging device stops power supply; the voltage detected by MCU is 17 V, thus it means that the battery is 17.4V high-voltage cell, and the lithium battery charging device can continuously charge the battery with 17.4 V voltage; after the battery is charged to 17.4V, the lithium battery charging device presents a 17.5 V small current signal, and the voltage detected by the MCU is 17.5 V; thus the lithium battery charging device stops power supply.

The other string of cell is carried out in the same manner during the charging process.

Figure 5:
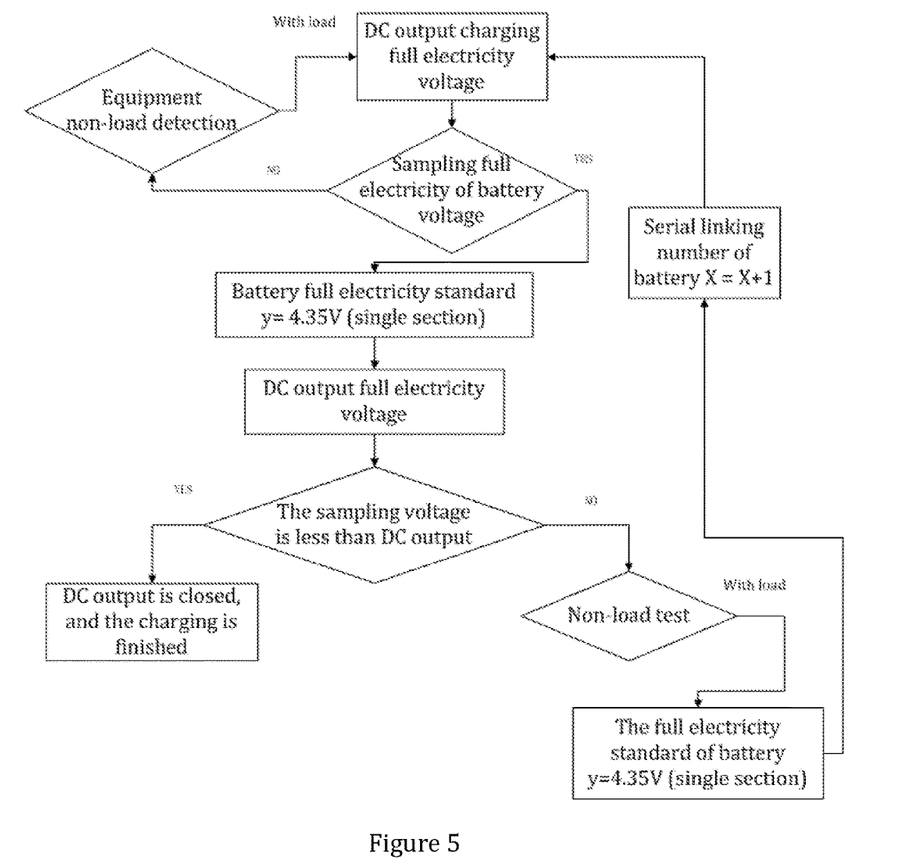
FIG. 5 represents a flow chart for charging state detection of the battery unit of the utility model.
Figure 6:
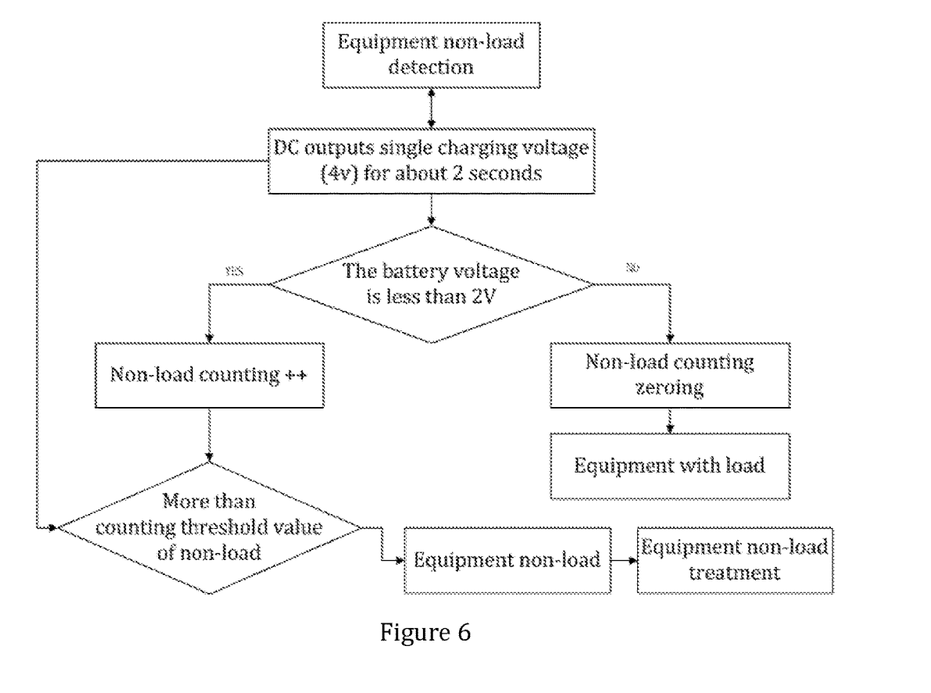
FIG. 6 represents a flow chart of idle load detection of the utility model.

When the battery unit is charged, the cell number should be distinguished firstly, and then ordinary cell (4.25V) and high-voltage cell (4.35V) should be distinguished; the specific operation flow should refer to FIGS. 5 and 6.

Note: the full electricity algorithm of battery voltage (DC charging):

$$X*Y$$

X: serial linking number of battery (section),
Y: full electricity voltage of single battery (4.25 or 4.35V).

Figure 7:
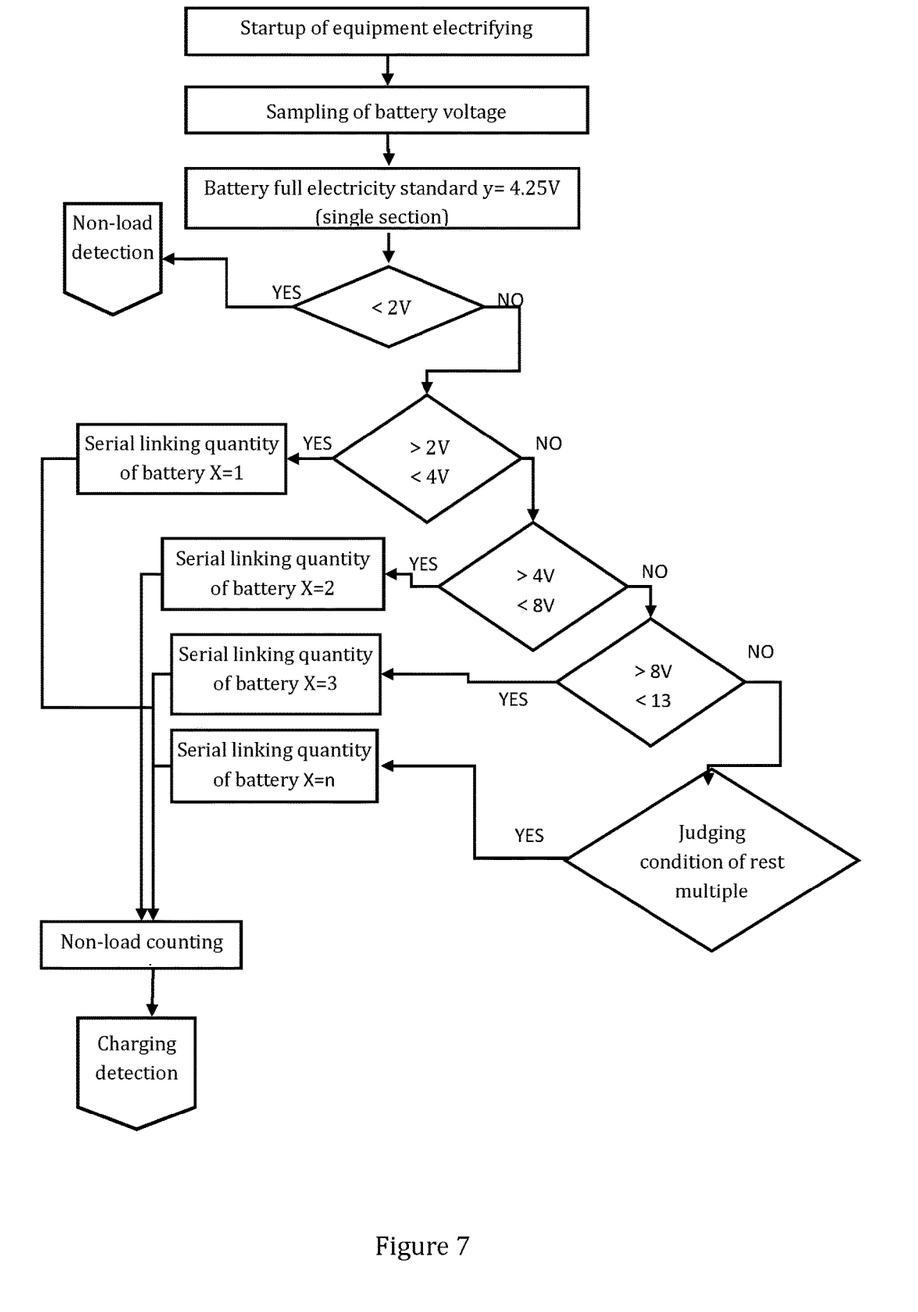
FIG. 7 represents the flow chart of initial identification of charging voltage of 4.25V and 4.35 V cores of the utility model.

The flow reference chart 7 for initial identification of charging voltage of the lithium battery charging device:

Note: full electricity charging of 1 battery of battery unit: 4.25V, 4.35V

Full electricity charging of 2 batteries of battery unit: 8.5V, 8.7V

Full electricity charging of 3 batteries of battery unit: 12.75, 13.05V . . . (4.25*nV, 4.35*nV).

The above mentioned is relatively good specific implementation mode of the utility model only; but the protection scale of the utility model is not limited to this; change or alternation easily realized by any technician who is familiar with the technical domain within the technical scale disclosed by the utility model should be covered in the protection scale of the utility model. Therefore, the protection scale of the utility model should be subject to the protection scale of the Claim.

The invention claimed is:

1. A multifunctional charging box, comprising
an upper cover,
an upper shell,
a lower shell, and
a base;
a battery unit arranged at the bottom part in the lower shell and fixed on the base and a control circuit board connected with the battery unit;
a control switch arranged on the upper shell, and the control switch is responsible for the on-off of power source and LED lamp and a model conversion,
an LED indicator arranged on the upper shell, and
an input interface arranged on the upper shell for charging the charging box of an electric tool, the multifunctional charging box further comprising output interfaces arranged on the upper shell for charging the electric tool and the products, an LED floodlight and a handle both arranged on the upper shell.

2. The multifunctional charging box according to claim 1, wherein the input interface applies DC input; through the input interface, the other power source charges the charging box.

3. The multifunctional charging box according to claim 1, wherein there are multiple output interfaces, and the output interfaces is set as USB interface, TYPE-C, DC interface, EC5 interface and others; through the output interfaces, the charging box charges the electric tool as well as other products, the electric tool includes unmanned machine, intelligent identifying mobile phone, flat panel and other electronic devices.

4. The multifunctional charging box according to claim 1, wherein the LED indicator indicates the current battery power state, which is segmentally displayed, the remaining power is learned in real time, and the working state of the charging box is displayed.

5. The multifunctional charging box according to claim 1, wherein the control switch is an integrated button.

6. The multifunctional charging box according to claim 1, wherein the LED floodlight is assisted as the charging box when the light is bad and also is independently used as floodlight, and sends SOS signal under the emergency situation.

7. The multifunctional charging box according to claim 1, wherein the battery unit consists of nickel hydrogen, nickel-cadmium, lithium battery, lead-acid battery, and charging batteries.

8. The multifunctional charging box according to claim 1, wherein the main control unit is arranged on the control circuit board, and the main control unit automatically identifies the serial number of the lithium battery and charges the correct voltage, so as to guarantee the charging safety of the battery.

* * * * *